(12) United States Patent
Murasato (10) Patent No.: US 10,828,805 B2
(45) Date of Patent: Nov. 10, 2020

(54) IMPRINT APPARATUS, CONTROL METHOD, AND METHOD FOR MANUFACTURING ARTICLE

(71) Applicant: CANON KABUSHIKI KAISHA, Tokyo (JP)

(72) Inventor: Naoki Murasato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 284 days.

(21) Appl. No.: 15/414,948

(22) Filed: Jan. 25, 2017

(65) Prior Publication Data

US 2017/0217054 A1  Aug. 3, 2017

(30) Foreign Application Priority Data

Feb. 1, 2016 (JP) ................. 2016-017114

(51) Int. Cl.
*B29C 35/02* (2006.01)
*G03F 7/00* (2006.01)
(Continued)

(52) U.S. Cl.
CPC ...... *B29C 35/0288* (2013.01); *B29C 35/0805* (2013.01); *B29C 59/026* (2013.01);
(Continued)

(58) Field of Classification Search
CPC ............. B29C 35/0288; B29C 59/026; B29C 35/0805; B29C 2035/0827;
(Continued)

(56) References Cited

U.S. PATENT DOCUMENTS 6,179,679 B1 *  1/2001  von Gutfeld ......... G02F 1/1339
349/190
7,833,389 B1 * 11/2010  Slafer ................. B29C 35/0888
204/237

(Continued)

FOREIGN PATENT DOCUMENTS

JP  2011100922 A  5/2011
JP  2011181548 A  9/2011
(Continued)

OTHER PUBLICATIONS

Office Action issued in Japanese Appln. No. 2016-017114 dated Dec. 3, 2019. English translation provided.

*Primary Examiner* — Peter L Vajda
*Assistant Examiner* — Caroline Montiel
(74) *Attorney, Agent, or Firm* — Rossi, Kimms & McDowell LLP (57) ABSTRACT

An imprint apparatus for forming a pattern in an imprint material on a substrate using an original as a mold, comprises an ultraviolet light generation device which irradiates with ultraviolet light which is curing light for curing the imprint material, and a control unit which controls a light amount of the ultraviolet light which is curing light. The control unit configured to perform a control of the light amount of the ultraviolet light acquires data of a defect distribution of the pattern formed on the substrate by the mold, and performs the control of the light amount of the ultraviolet light in a plurality of shot areas on the substrate based on the acquired data of the defect distribution.

11 Claims, 8 Drawing Sheets

(51) Int. Cl.
  *B29C 35/08*    (2006.01)
  *B29C 59/02*    (2006.01)
  *H01L 21/67*    (2006.01)
  *H01L 21/3105*  (2006.01)
  *B29L 31/34*    (2006.01)

(52) U.S. Cl.
  CPC ...... *G03F 7/0002* (2013.01); *H01L 21/31058* (2013.01); *H01L 21/67092* (2013.01); *H01L 21/67253* (2013.01); *B29C 2035/0827* (2013.01); *B29L 2031/34* (2013.01); *H01L 21/67115* (2013.01)

(58) Field of Classification Search
  CPC ......... H01L 21/31058; H01L 21/67092; H01L 21/67253; H01L 21/67115; G03F 7/0002; B29L 2031/34

See application file for complete search history.

(56) References Cited

U.S. PATENT DOCUMENTS

| | | |
|---|---|---|
| 10,228,616 B2 | 3/2019 | Sato |
| 2010/0104984 A1* | 4/2010 | Shiobara ................ B82Y 10/00 430/319 |
| 2011/0111593 A1 | 5/2011 | Kanno |
| 2011/0309548 A1* | 12/2011 | Aihara ................... B82Y 10/00 264/293 |
| 2013/0241096 A1* | 9/2013 | Shudo ................... G03F 7/0002 264/40.5 |
| 2014/0105583 A1* | 4/2014 | Johnson ........... H01L 21/67115 392/416 |
| 2014/0339734 A1* | 11/2014 | Murakami ............ B29C 43/021 264/293 |

FOREIGN PATENT DOCUMENTS

| | | |
|---|---|---|
| JP | 2013089663 A | 5/2013 |
| JP | 2014120604 A | 6/2014 |
| JP | 2015053449 A | 3/2015 |
| JP | 2015233071 A | 12/2015 |

* cited by examiner

IMPRINT APPARATUS, CONTROL METHOD, AND METHOD FOR MANUFACTURING ARTICLE

BACKGROUND OF THE INVENTION

Field of the Invention

The present invention relates to an imprint apparatus, a control method, and a method for manufacturing an article.

Description of the Related Art

In an imprint technology for manufacturing a semiconductor device or the like, a pattern is formed by contacting a patterned mask onto a silicon substrate to which an imprint material is applied and curing the imprint material using ultraviolet light or heat. In the imprint technology, helium which can be transmitted through the mask and the imprint material is filled into a sealing space to prevent an air reservoir from remaining between the mask and the imprint material, in bringing the mask and the imprint material on the silicon substrate into contact. If a concentration of helium is insufficient, oxygen remains in the sealing space and curing the imprint material is inhibited, and thereby pattern defects occur. Occurrence of the pattern defects due to this curing inhibition may be reduced by increasing an irradiation amount of curing light.

As a technology to give a distribution in a light amount of curing light in an imprint area to reduce pattern defects, Japanese Patent Laid-Open No. 2011-181548 discloses a method of reducing a mold release force by decreasing the light amount of curing light in a center portion in which pattern defects are likely to occur in mold releasing. In Japanese Patent Laid-Open No. 2011-181548, a light amount is adjusted by using a photomask which has a transmittance distribution to decrease the light amount of curing light in the center portion. Japanese Patent Laid-Open No. 2014-120604 discloses a method of reducing the mold release force by weakening the light amount of curing light in an outer peripheral area of a pattern. In Japanese Patent Laid-Open No. 2014-120604, the light amount of curing light is adjusted with a combination of switching of a filter with a transmittance distribution and light-shielding shutter switching time by a light-shielding plate.

However, Japanese Patent Laid-Open No. 2011-181548 and Japanese Patent Laid-Open No. 2014-120604 disclose a technology for reducing pattern defects caused by an adhesion force generated in releasing a mold from a cured imprint material, and the technology cannot be applied to pattern defects caused by curing inhibition due to oxygen that occurs at low concentration of helium. For the pattern defects caused by curing inhibition due to oxygen, it is necessary to irradiate with a light amount of curing light according to a helium concentration distribution or a helium flow rate.

SUMMARY OF THE INVENTION

The present invention provides, for example, an imprint apparatus which is capable of reducing pattern defects formed on a substrate.

According to one aspect of the present invention, an imprint apparatus for forming a pattern of an imprint material on a substrate using a mold is provided that comprises a light source configured to irradiate with curing light for curing the imprint material, and a control unit configured to acquire data of a defect distribution of the pattern formed on the substrate by the mold, and to perform a control of a light amount of the curing light for curing the imprint material in a plurality of shot areas on the substrate based on the acquired data of the defect distribution.

Further features of the present invention will become apparent from the following description of exemplary embodiments with reference to the attached drawings.

DESCRIPTION OF THE EMBODIMENTS

First Embodiment

Figure 1:
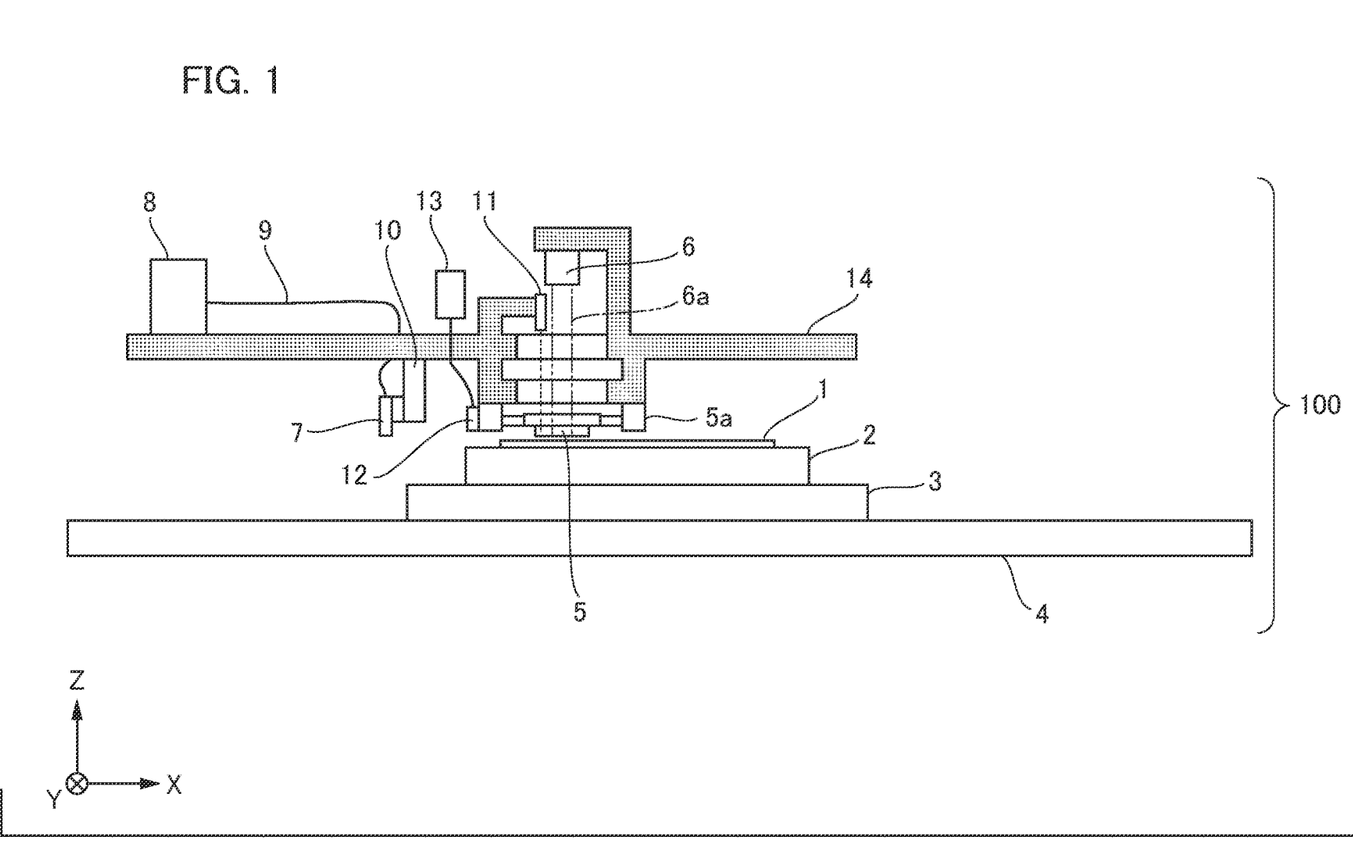
FIG. 1 is an apparatus configuration diagram of an imprint apparatus.
Figure 2A:
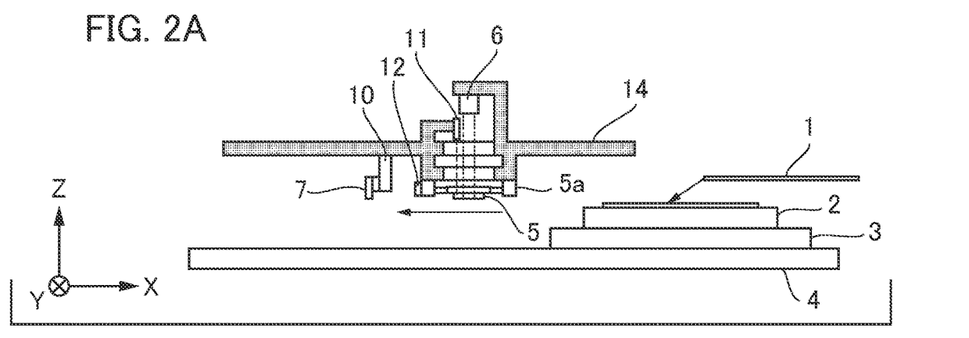
FIGS. 2A to 2D are for explaining an imprint sequence.
Figure 2B:
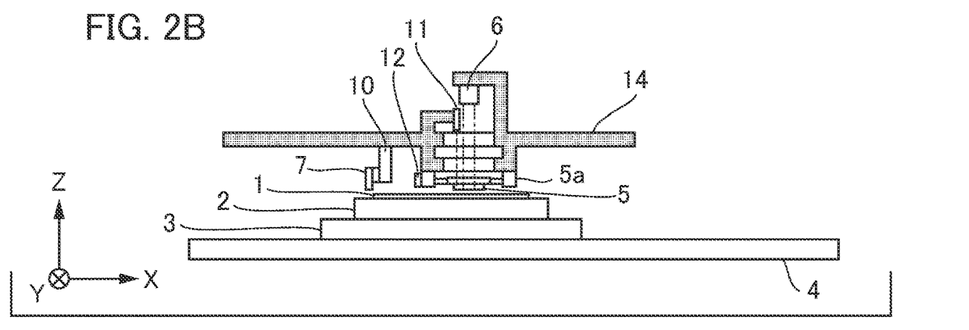
Figure 2C:
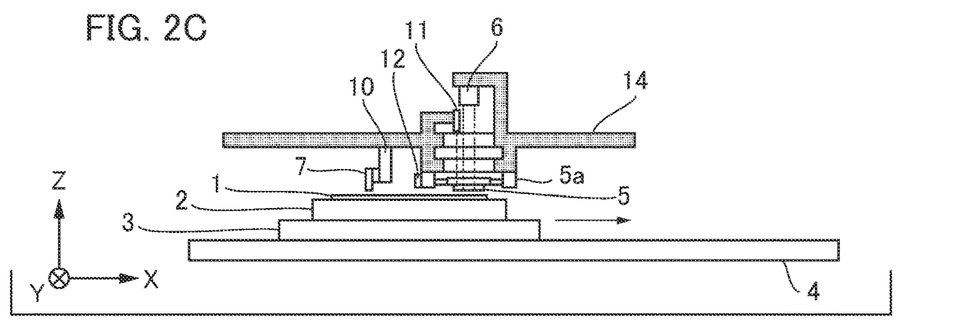
Figure 2D:
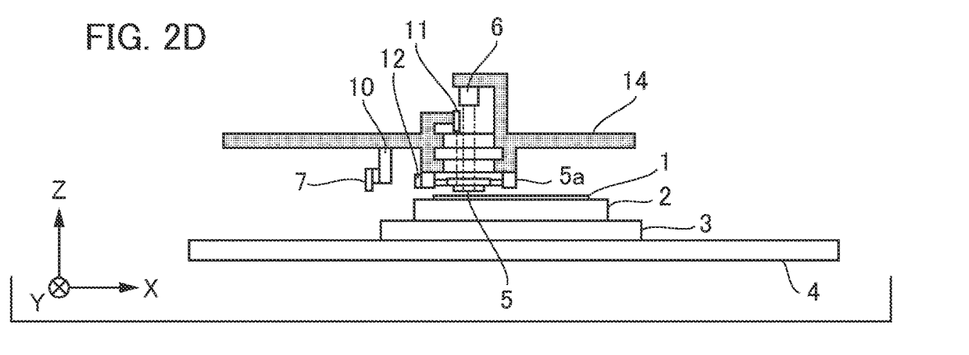

An outline of an imprint apparatus according to one embodiment of the present invention will be described with reference to FIG. 1. FIG. 1 shows an example of an apparatus configuration of the imprint apparatus. An imprint apparatus 100 of the present embodiment is configured to form a pattern in a plurality of shot areas on a substrate by repeating an imprint cycle. Here, one imprint cycle is a cycle of forming a pattern in one shot area of the substrate by curing the imprint material, in a state in which an original (mold) contacts with an uncured resin (imprint material).

In a substrate 1, an element pattern corresponding to a pattern of an original is formed on a surface layer by transferring the pattern of the original thereto. A substrate fine movement stage 2 is a stage in which the substrate 1 can be driven in an XY direction and a rotation direction in an XY plane in little amounts (about 1 mm in the XY direction, about a few degrees in the rotation direction in the XY plane). A substrate rough movement stage 3 is a substrate stage in which the substrate 1 can be moved in large amounts in the XY direction, and can move an imprint area from a carry-in/carry-out position of the substrate 1 toward an entire surface of the substrate in directions orthogonal to each other.

A base frame 4 of an imprint apparatus holds and positions the substrate fine movement stage 2 and the substrate rough movement stage 3. An original 5 has a convex-concave pattern engraved on a surface thereof and the engraved pattern is transferred to the substrate 1 by interposing an imprint material between the original 5 and the substrate 1 and transferring the original to the substrate. A driving device 5a which performs a vertical drive of the original performs an operation of bringing the original 5 an uncured resin on the substrate 1 into contact. An ultraviolet light generation device 6 irradiates the uncured resin with ultraviolet light 6a through the original 5 to cure the resin. In addition, the ultraviolet light generation device 6 includes, for example, a point light source such as a halogen lamp or a mercury lamp for generating i-rays or g-rays, and has functions of collecting and shaping light generated by the point light source.

A dispenser 7 can apply a predetermined amount of uncured resin onto the substrate 1 by discharging fine liquid droplets of uncured resin. A tank 8 for storing the uncured resin supplies the uncured resin to the dispenser 7 through a pipe 9. A movable device 10 is a movable unit which moves the dispenser 7 between a discharge position and a retracted position (maintenance position), and is positioned at a discharge position during a normal discharge operation. During maintenance of the dispenser 7, the movable device is moved to the retracted position (maintenance position) and cleaning and replacement of the dispenser 7 is performed.

An alignment scope 11 is a microscope which aligns pattern positions of the original 5 and the substrate 1 after discharging and applying the uncured resin onto the substrate 1 using the dispenser 7. A mutual alignment is performed by measuring a state in which an alignment mark provided on the original 5 and an alignment mark on the substrate 1 are superimposed, using the microscope. A helium nozzle 12 is a nozzle for blowing helium gas which is a gas for facilitating filling of the imprint material and for preventing curing inhibition by oxygen. In particular, it is not limited to helium gas, and may be a gas having a function similar to helium gas. The tank 13 is a tank for storing helium gas and supplies helium gas to a nozzle portion through a pipe. A plate 14 is for supporting and fixing the original 5 through the helium nozzle 12.

A flow of a series of imprinting operations will be described using FIGS. 2A to 2D and 3A to 3C. FIGS. 2A to 2D and FIGS. 3A to 3C are for explaining an imprint sequence. In a process of FIG. 2A, the substrate 1 is mounted on the substrate fine movement stage 2 and the substrate rough movement stage 3. In a process of FIG. 2B, the substrate 1 starts to move under the dispenser 7 for discharging an uncured resin, by using the substrate fine movement stage 2 and the substrate rough movement stage 3. Next, as the process proceeds to that of FIG. 2C, the dispenser 7 completes an application of a predetermined amount of uncured resin on to the substrate. Thereafter, as the substrate fine movement stage 2 and the substrate rough movement stage 3 return under the original 5, helium gas is blown onto the substrate 1 by using the helium nozzle 12 and a space for contacting (a space between the mold and the substrate) is filled with helium gas. Then, the process proceeds to that of FIG. 2D, the alignment scope 11 superimposes the alignment mark of the original 5 and the alignment mark on the substrate 1 by driving the substrate fine movement stage 2, and performs relative position adjustment of the substrate 1 and the original 5.

Figure 3A:
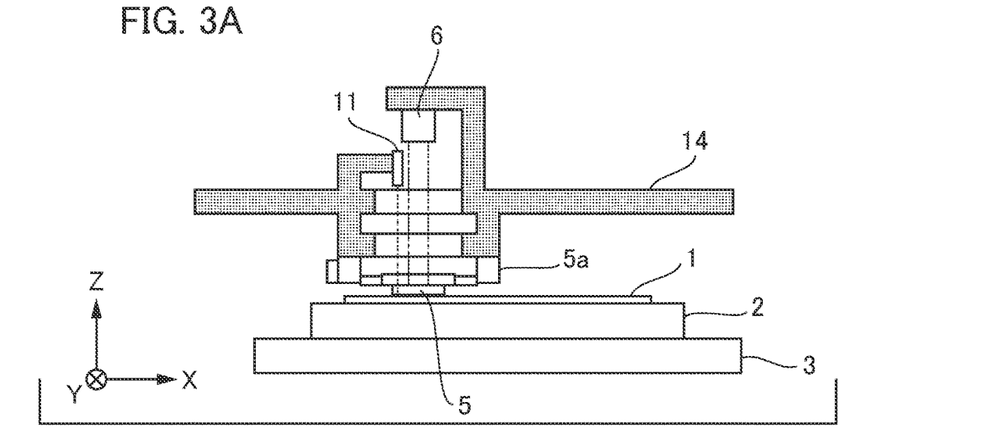
FIGS. 3A to 3C are for explaining the imprint sequence.
Figure 3B:
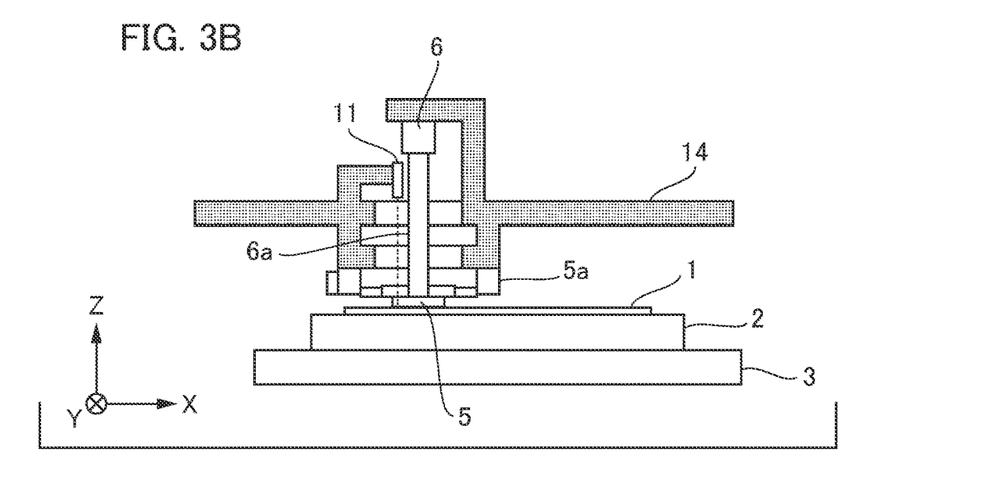
Figure 3C:
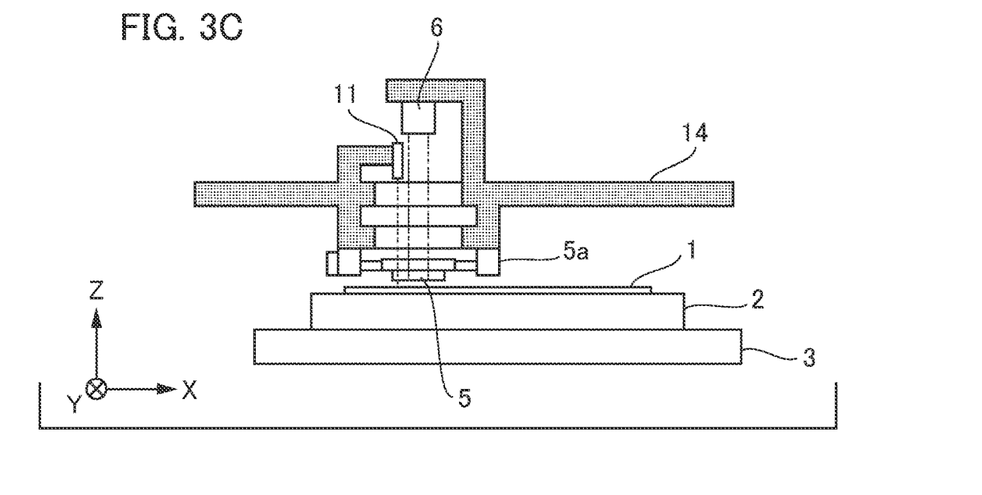

Next, in a process A of FIG. 3A, the original 5 is lowered toward the substrate 1 by using the driving device 5a, and a pattern on the original 5 is brought the uncured resin into contact and transferred to the uncured resin. Then, in the process of FIG. 3B, the ultraviolet light 6a is irradiated from the ultraviolet light generation device 6, is transmitted through the original 5, and finally irradiates an uncured resin (resist). At this stage, the uncured resin is cured. In a next process of FIG. 3C, the original 5 is peeled off and allowed to retreat (released) upward, and thereby a patterned resin layer is formed on the substrate 1 to end the imprinting operation. By undergoing the above processes, an imprint apparatus for replicating and imprinting the pattern of the original on the substrate performs the imprinting operations.

Figure 4:
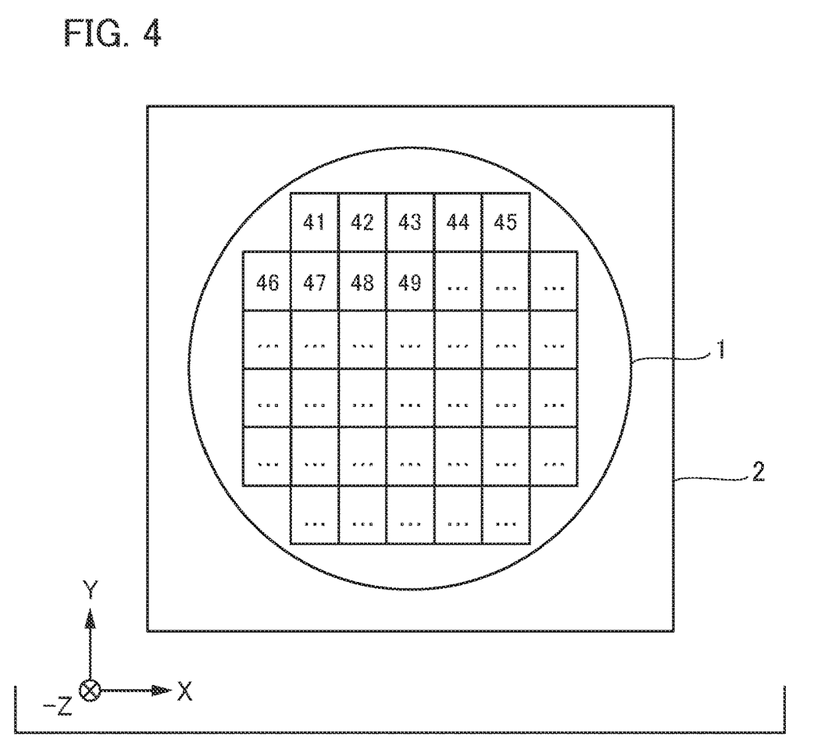
FIG. 4 is for explaining an order of an imprint on a wafer.

FIG. 4 is for explaining an order of imprint on a wafer. Each of rectangles on the wafer of FIG. 4 shows one shot area. The imprinting operations are performed sequentially from an upper left shot area 41 in an X direction on the substrate 1 shown in FIG. 4. If the imprinting operation on a line is completed, the line to be imprinted is shifted one down in a Y direction and the imprinting operations are performed sequentially from a left end of the line in the X direction. That is, the imprinting operations are performed in an order of continuous shot numbers 41, 42, 43, 44, 45, 46, 47, 48, and 49 in FIG. 4.

Figure 5:
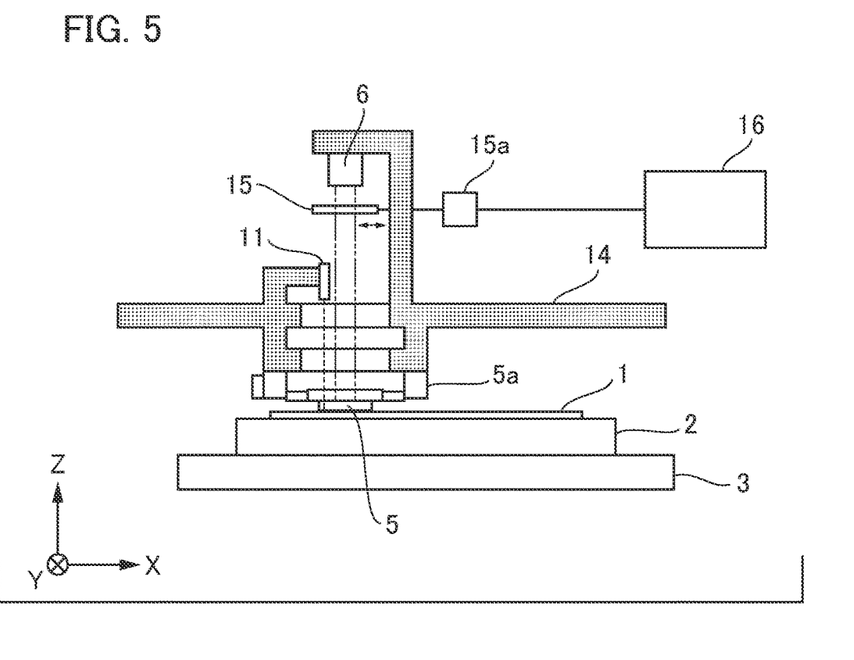
FIG. 5 is for explaining a configuration of an imprint apparatus of a first embodiment.

FIG. 5 shows a configuration of the imprint apparatus to which the configuration of a first embodiment is added. In the imprint apparatus of the first embodiment, a shutter (light-shielding plate) 15, a shutter driving mechanism 15a, and a calculator 16 are added. If the shutter 15 is disposed in an optical path of the ultraviolet light generation device 6, the shutter 15 shields ultraviolet light. If the shutter 15 is not disposed in the optical path of the ultraviolet light generation device 6, the imprint material is exposed by transmission of ultraviolet light. The shutter driving mechanism 15a is connected to the shutter 15 and the calculator (computer) 16. The calculator 16 is configured to calculate, for example, open/close times (opening and closing (shielding) times) of the shutter for each shot. The calculator 16 is configured to acquire data of a defect amount (defect distribution) at each imprint position on the substrate 1, and calculate and determine a light amount of curing light necessary for curing the imprint material based on the acquired data of the defect distribution. Then, the calculator is configured to calculate the open/close times of the shutter according to each imprint position based on the determined light amount. The shutter driving mechanism 15a performs opening and closing of the shutter according to the open/close times of the shutter sent from the calculator 16. Accordingly, the calculator 16 functions as a control unit for controlling an exposure amount of the ultraviolet light 6a and controls an exposure amount for each shot area on the substrate 1.

Figure 6:
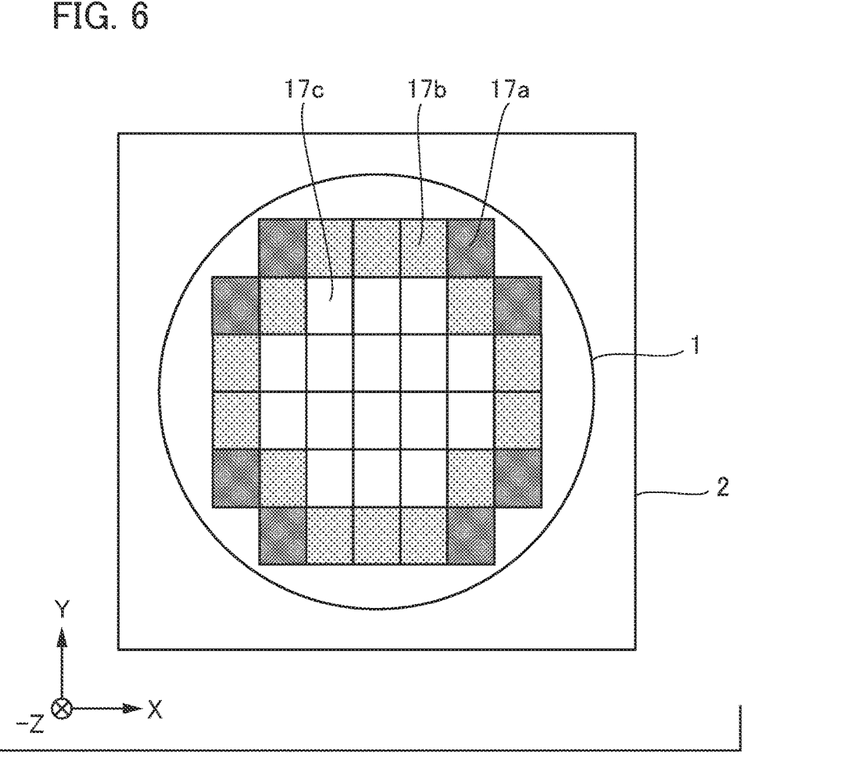
FIG. 6 is for explaining a defect distribution on a substrate of the first embodiment.

FIG. 6 is for explaining a defect distribution of the pattern formed on the substrate of the first embodiment. An example of a defect amount distribution at an imprint position on the substrate 1 is indicated with a density of a gray color. The defect distribution of the pattern is a result of an inspection obtained by inspecting an imprinted wafer with an inspection device. At a position close to an end portion of the substrate 1 such as an area 17a, a concentration of helium is low and pattern defects due to non-curing caused by an effect of curing inhibition by oxygen are likely to occur. Even in an area 17b which is a position close to an outer periphery, the helium concentration is low and defects are likely to occur next to the area 17a. At a position close to a center position such as an area 17c, the concentration of helium is sufficient and defects are less likely to occur. In this manner, the helium concentration distribution depends on a position on the wafer, and thus the defect distribution of the pattern also depends on a position on the wafer.

In an area which is close to the end portion of the substrate 1 such as the area 17a and in which the concentration of helium is low and pattern defects due to non-curing caused by the effect of curing inhibition by oxygen are likely to occur, it is necessary to increase the light amount (exposure amount) of curing light. On the other hand, in an area which is close to a center position of the substrate 1 such as the area 17c and in which the concentration of helium is sufficient and defects are less likely to occur, it is not necessary to increase the exposure amount. The exposure amount can be realized by adjusting a light amount of the ultraviolet light generation device 6 which is a light source or by adjusting an exposure time, that is, an opening time of the shutter.

As described above, the imprint apparatus of the first embodiment can calculate the exposure amount and the opening time of the shutter according to the defect distribution of the pattern on the substrate 1, perform exposure in accordance with the imprint position by driving the shutter based on the result of the calculation, and reduce the pattern defects.

Second Embodiment

Figure 7:
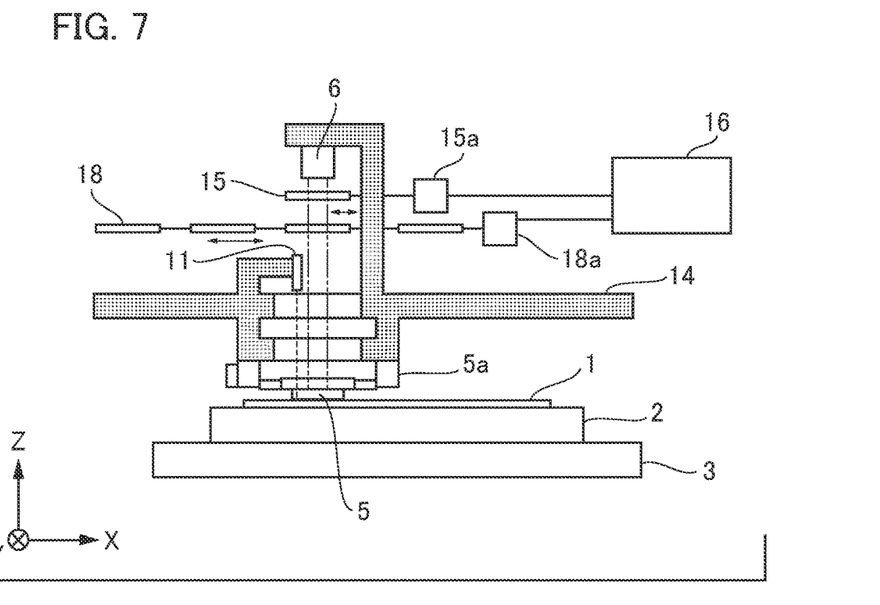
FIG. 7 is for explaining a configuration of an imprint apparatus of a second embodiment.

FIG. 7 shows an example of a configuration of an imprint apparatus of a second embodiment. The imprint apparatus of the present embodiment further comprises a filter 18 having a transmittance distribution and a filter driving mechanism 18a in addition to the shutter 15 and the calculator 16 of Embodiment 1. The filter 18 is configured by a plurality of filters with different transmittance distributions. The calculator 16 is connected also to the filter driving mechanism 18a. The calculator 16 selects a filter in addition to the open/close times of the shutter in accordance with the amount of necessary curing light calculated based on the acquired data of the defect distribution on the substrate 1 and also issues a command for filter switching (putting the filter in/out an optical path). The filter driving mechanism 18a receives the command for filter switching from the calculator 16 and can perform filter switching to a filter selected among the plurality of filters with different transmittance distributions.

Figure 8:
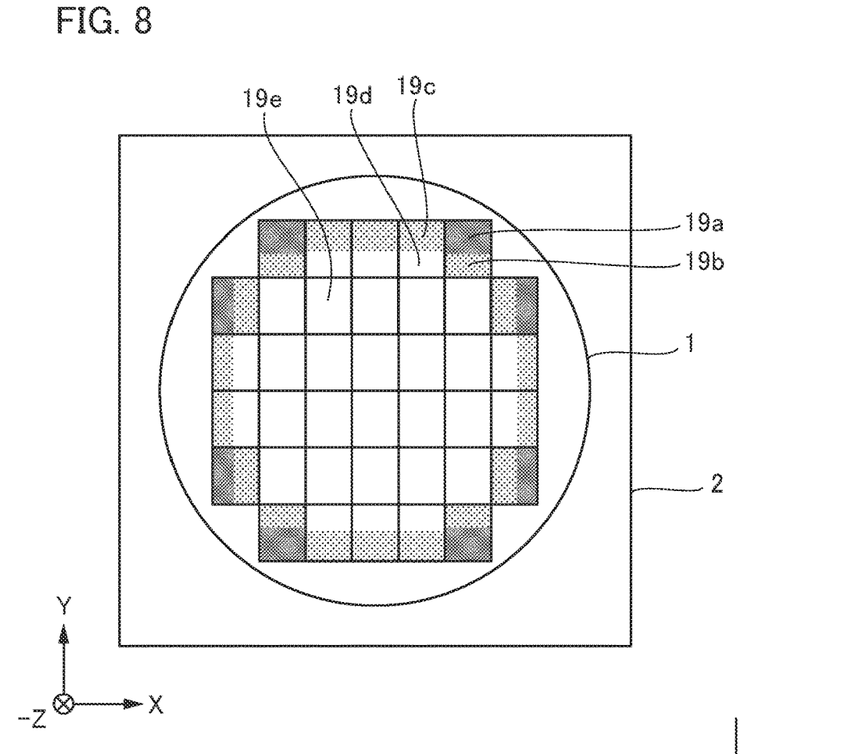
FIG. 8 is for explaining a defect distribution on a substrate of the second embodiment.

FIG. 8 is for explaining a defect distribution on the substrate of the second embodiment. An example of a defects amount distribution at an imprint position on the substrate 1 is indicated with a density of a gray color. As shown in FIG. 8, there are different helium concentration distributions even in an imprint area of the same one shot, and thereby there are different defect distributions. If an upper right area is taken as an example, in a position such as an area 19a close to an end portion even in the same imprint area, a concentration of helium is low, defects due to insufficient curing caused by the effect of curing inhibition by oxygen are likely to occur, and a defect density is high. On the other hand, even in the same imprint area, an area 19b is positioned closer to a center side than the area 19a. However, since the area 19b is close to an outer periphery, a concentration of helium is low next to the area 19a and defects are likely to occur, but a defect density is lower than that of the area 19a. In addition, if immediate left imprint area is taken as an example, since an area 19c is close to the outer periphery, a concentration of helium is the same as that of the area 19b and defects are likely to occur, but a defect density is lower than that of the area 19a. At a position close to the center position such as an area 19d, a concentration of helium is sufficient and defects are less likely to occur. As described above, there are different helium concentration distributions even in the same imprint area, and thereby there are different defect distributions. On the other hand, like an area 19e, there are also areas in which a uniform concentration of helium is maintained and the pattern defect density is same, in the same imprint area. If there is a defect distribution vertically or horizontally in the same imprint area, it is possible to have an exposure amount distribution by putting (switching) a filter with a transmittance distribution in an optical path in the same arrangement. If there is a uniform defect distribution in the same imprint area, there is no filter or there may be switching to a filter with a uniform transmittance distribution.

In this manner, the imprint apparatus of the embodiment in which the filter switching mechanism as a unit configured to have the exposure amount distribution in the imprint area of the same one shot is added can further reduce the pattern defects.

Third Embodiment

Figure 9:
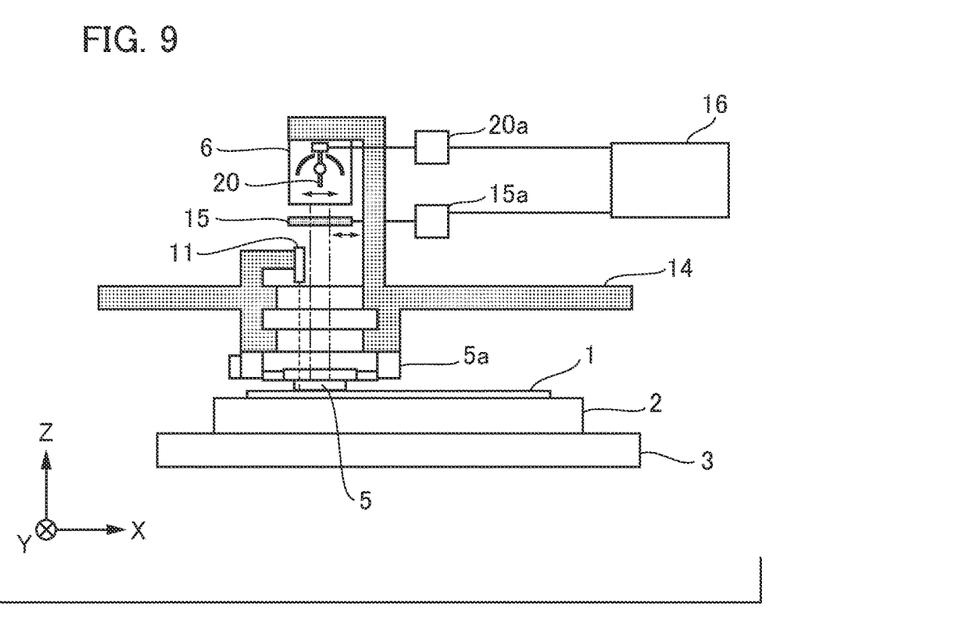
FIG. 9 is for explaining a configuration of an imprint apparatus of a third embodiment.

FIG. 9 shows a configuration example of an imprint apparatus of a third embodiment. The imprint apparatus of the present embodiment comprises a light source lamp 20 and a lamp position driving mechanism 20a as a mechanism for driving a position of a lamp, in addition to the shutter 15 and the calculator 16 of the first embodiment. The lamp position driving mechanism 20a is connected to the light source lamp 20. The lamp position driving mechanism 20a is connected to the calculator 16, and is a driving unit for driving the light source lamp 20 based on a lamp position command from the calculator 16. The calculator 16 is a control unit for controlling an exposure amount of the ultraviolet light 6a, and controls the lamp position driving mechanism 20a in addition to the shutter driving mechanism 15a. Therefore, with respect to defect distributions in top, bottom, left, and right as shown in FIG. 8 of the second embodiment acquired by the calculator 16, it is possible to irradiate with curing light having an exposure amount distribution corresponding to defect distributions by controlling a position of the light source lamp 20. It is possible to cause the exposure amount distribution without loss of exposure energy compared to a filter. The filter switching mechanism and the lamp position driving mechanism may be configured to be combined.

As described above, the imprint apparatus of the third embodiment in which the lamp position driving mechanism as a unit configured to have an exposure amount distribution in an imprint area of the same one shot is added, can reduce pattern defects without loss of exposure energy.

Fourth Embodiment

Figure 10:
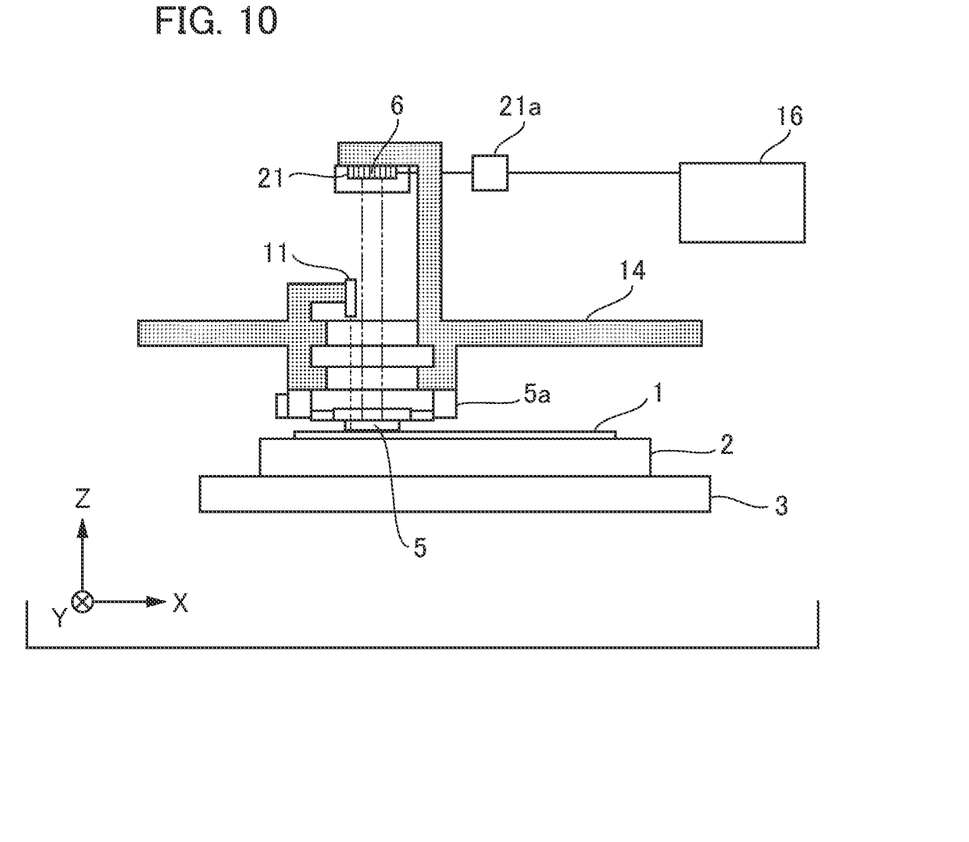
FIG. 10 is for explaining a configuration of an imprint apparatus of a fourth embodiment.

FIG. 10 shows an example of a configuration of an imprint apparatus of a fourth embodiment. The imprint apparatus of the present embodiment is configured to use an LED element as a light source of the ultraviolet light generation device 6. An LED element group 21 is disposed inside the ultraviolet light generation device 6 includes and the LED element group 21 is connected to an LED power control device 21a. The LED power control device 21a is connected to the calculator 16 and is capable of individually changing a power to each of the LED elements based on an exposure amount distribution or an LED power amount distribution calculated based on a defect distribution by the calculator 16. The LED element is, for example, an ultraviolet LED.

Figure 11:
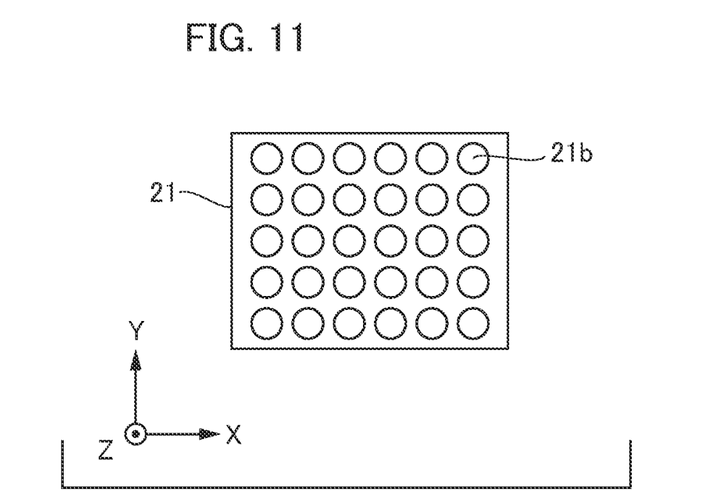
FIG. 11 is for explaining a light source element unit of the imprint apparatus of the fourth embodiment.

FIG. 11 is for explaining the LED element group 21 that is a light source element unit of the imprint apparatus of the fourth embodiment. FIG. 11 shows the LED element group 21 viewed in a −Z direction. The LED element group 21 has a plurality of LED elements, and FIG. 11 shows a arrangement of the LED elements on a plane in a direction perpendicular to an irradiation direction of light of the LED element group 21. An LED element 21*b* is disposed in an area corresponding to an irradiation area on the substrate 1 and a configuration of optical elements in an optical path. According to an exposure amount or optical characteristics of one LED element, a density or the number of elements is determined. Moreover, in this embodiment, each LED element is covered with a hemispherical dome lens, but the LED element may be exposed corresponding to an imaging condition of a light source. It is possible to individually control the exposure amount of the LED element 21*b* by the LED power control device 21*a*.

Figure 12:
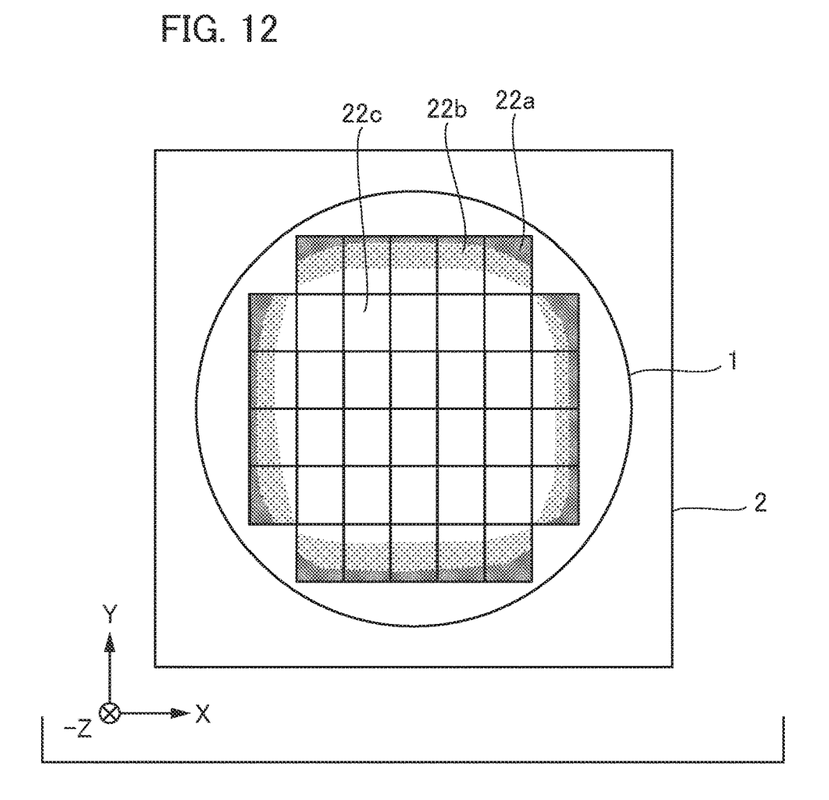
FIG. 12 is for explaining a defect distribution on a substrate of the fourth embodiment.

FIG. 12 is for explaining a defect distribution on the substrate of Embodiment 4. An example of a defect amount distribution at an imprint position on the substrate 1 is indicated by a density of a gray color. A concentration of helium is low at a position close to the end portion of the substrate 1 such as an area 22*a*, and here defects due to a curing shortage caused by the effect of curing inhibition by oxygen is most likely to occur. The area 22*b* is positioned inside of the area 22*a*, and here defects are next most likely to occur. At a position close to a center position, such as an area 22*c*, there are few defects and it is not necessary to increase the exposure amount. In such a defect distribution, there are both a fine area distribution and a fine defect concentration distribution in an imprint area of the same one shot. Therefore, it is necessary to have a fine exposure amount distribution in the same imprint area. By individually controlling an exposure amount of the LED element 21*b* of the LED element group 21, it is possible to perform a control on the light amount of curing light and to realize a desired fine exposure amount distribution without using a shutter mechanism, a filter switching mechanism, a lamp position driving mechanism, or the like.

Figure 13:
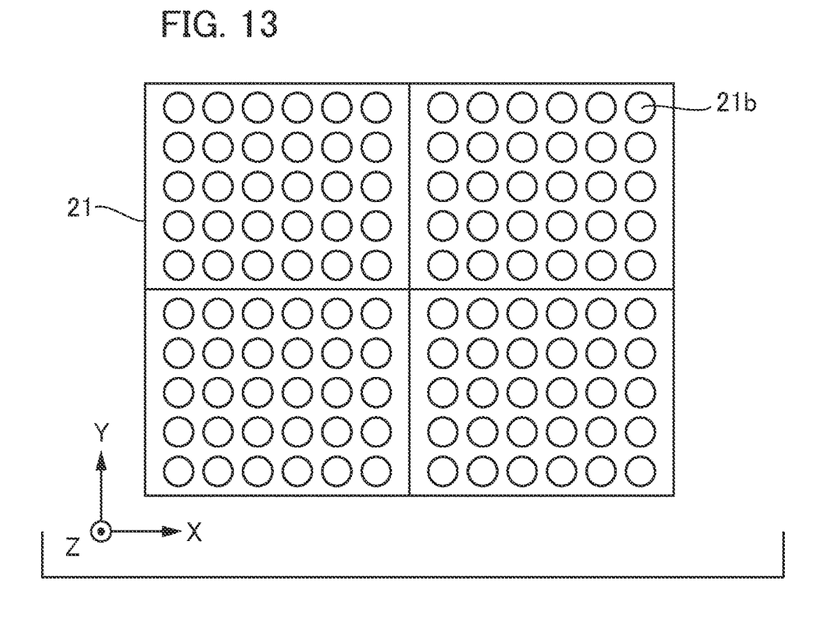
FIG. 13 is for explaining a light source element unit of an apparatus modified from the imprint apparatus of the fourth embodiment.

Furthermore, the configuration of the fourth embodiment can also be applied to a case in which an imprint area for performing an imprint at one time is increased by disposing the increased number of LED element groups as shown in FIG. 13. FIG. 13 is a diagram in which four of the LED element groups 21 shown in FIG. 11 are aligned. For example, for a configuration in which the imprint area is quadrupled, it is possible to obtain the same effect by aligning the four LED element groups 21 corresponding the quadrupled imprint area, and individually performing a power control on the LED elements 21*b*. The LED element groups 21 may be aligned as many as a number corresponding to a size of an imprint area for performing an imprint at one time. Note that a light source may be a LED element group, and a configuration in which the shutter mechanism, the filter switching mechanism, and the lamp position driving mechanism are combined may be provided.

In this manner, the imprint apparatus of the fourth embodiment comprising the LED element group which is the light source as a unit configured to have the exposure amount distribution in the imprint area can generate a the fine exposure amount distribution and further reduce the pattern defects by individually controlling the power of each LED element.

These embodiments are applicable to an imprint method and an imprint apparatus. Specifically, these embodiments are applicable to an imprint method and an imprint apparatus for accurately positioning (alignment) an original such as a template or a reticle and a substrate such as a semiconductor wafer, and transferring a pattern of the original to the substrate.

Embodiment of Article Manufacturing Method

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of treating (processing) the substrate on which a pattern has been formed instead of the etching step. The article manufacturing method of the present embodiment has an advantage, as compared with a conventional method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-017114, filed Feb. 1, 2016, which is hereby incorporated by reference wherein in its entirety.

What is claimed is:

1. An imprint apparatus for forming a pattern of an imprint material on a substrate using a mold where gas is supplied to prevent inhibition of curing of the imprinted material, the imprint apparatus comprising:
a light source configured to irradiate with curing light for curing the imprint material on a first substrate; and
a computer configured to:
control light amounts of curing light from the light source for curing the imprint material in a plurality of shot areas on the first substrate based on a defect distribution with respect to a position on a second substrate imprinted with the supplied gas, caused by insufficient concentration of the gas, which is acquired in advance by inspecting the second substrate, including providing a greater light amount of curing light to a first area on the first substrate than a light amount of curing light to a second area, which has a less defect than the first area, on the first substrate.

2. The imprint apparatus according to claim 1, further comprising:
a filter with a transmittance distribution,
wherein the computer is configured to control putting the filter in an optical path or putting out the optical path.

3. The imprint apparatus according to claim 1, further comprising:
a plurality of filters with different transmittance distributions,
wherein the computer is configured to select a filter to be put in an optical path among the plurality of filters based on the defect distribution.

4. The imprint apparatus according to claim 1, further comprising:
a driving unit for driving the light source,
wherein the computer is configured to control the driving unit to control a position of the light source.

5. The imprint apparatus according to claim 1, wherein:
the light source includes a plurality of LED elements, and
the computer is configured to individually control power for the plurality of LED elements to control the light amount of curing light.

6. The imprint apparatus according to claim 1, wherein the supplied gas is helium gas.

7. The imprint apparatus according to claim 6, wherein the defect distribution includes data of defect about respective shot areas.

8. The imprint apparatus according to claim 6, wherein the defect distribution includes data of defect about respective areas in one shot area.

9. A control method of providing curing light for curing an imprint material using an imprint apparatus that forms a pattern of the imprint material on a substrate using a mold where gas is supplied to prevent inhibition of curing of the imprinted material, the control method comprising:
providing a light source configured to irradiate with curing light for curing the imprint material on a first substrate; and
controlling light amounts of curing light from the light source for curing imprint material in a plurality of shot areas on the first substrate based on a defect distribution with respect to a position on a second substrate imprinted with the supplied gas, caused by insufficient concentration of the gas, which is acquired in advance by inspecting the second substrate, including providing a greater light amount of curing light to a first area on the first substrate than a light amount of curing light to a second area, which has a less defect than the first area, on the first substrate.

10. A method of manufacturing an article, the method comprising the steps of:
forming a pattern on a substrate by curing an imprint material using curing light controlled by a control method of providing the curing light; and
processing the substrate on which the pattern is formed in the pattern forming step;
wherein the control method includes the steps of:
providing a light source configured to irradiate with curing light for curing the imprint material; and
controlling light amounts of curing light from the light source for curing imprint material in a plurality of shot areas on the first substrate based on a defect distribution with respect to a position on a second substrate imprinted with the supplied gas, caused by insufficient concentration of the gas, which is acquired in advance by inspecting the second substrate, including providing a greater light amount of curing light to a first area on the first substrate than a light amount of curing light to a second area, which has a less defect than the first area, on the first substrate.

11. The imprint apparatus according to claim 1, further comprising a gas storage that supplies the gas for preventing curing inhibition of the imprint material in a pressing area between the imprint material and the mold.

* * * * *